United States Patent
Kaneda et al.

(10) Patent No.: US 12,244,915 B2
(45) Date of Patent: Mar. 4, 2025

(54) IMAGING DEVICE WITH UPPER MOUNTED FAN ACCOMMODATION PORTION

(71) Applicant: Panasonic Intellectual Property Management Co., Ltd., Osaka (JP)

(72) Inventors: Norikazu Kaneda, Osaka (JP); Hiroyuki Kuroki, Osaka (JP); Hiroki Kasugai, Osaka (JP); Yuuji Matsuo, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 125 days.

(21) Appl. No.: 18/074,484

(22) Filed: Dec. 4, 2022

(65) Prior Publication Data
US 2023/0239555 A1    Jul. 27, 2023

(30) Foreign Application Priority Data
Jan. 26, 2022  (JP) .................................. 2022-010084

(51) Int. Cl.
  *H04N 23/52*  (2023.01)
  *H05K 7/20*  (2006.01)
(52) U.S. Cl.
  CPC ......... *H04N 23/52* (2023.01); *H05K 7/20145* (2013.01); *H05K 7/20172* (2013.01)
(58) Field of Classification Search
  CPC .................................................... H04N 23/52
  See application file for complete search history.

(56) References Cited

U.S. PATENT DOCUMENTS

| | | | |
|---|---|---|---|
| 2,272,046 A | * | 2/1942 | Findley .............. B60H 1/00464 165/125 |
| 5,300,976 A | | 4/1994 | Lim et al. |
| 5,951,137 A | | 9/1999 | Bortz |
| 6,135,714 A | | 10/2000 | Hsu |
| 10,462,929 B1 | | 10/2019 | Su et al. |
| 11,852,834 B1 | | 12/2023 | Wang et al. |
| 2003/0184717 A1 | | 10/2003 | Kim |

(Continued)

FOREIGN PATENT DOCUMENTS

| | | |
|---|---|---|
| JP | 2006-340214 A | 12/2006 |
| JP | 2012-047798 A | 3/2012 |

(Continued)

OTHER PUBLICATIONS

JP2019-191433A; Honda Takanori, "Cooling Structure of Imaging Device"; Oct. 31, 2019; pp. 1-13; English Translation (Year: 2019).*

(Continued)

*Primary Examiner* — Cynthia Segura
(74) *Attorney, Agent, or Firm* — Renner, Otto, Boisselle & Sklar, LLP

(57) ABSTRACT

An imaging device includes an imaging main body; a fan accommodation portion provided in an upper portion of the imaging main body; and a cooling fan disposed in the fan accommodation portion, wherein the fan accommodation portion includes an upper surface, a pair of side surfaces, and a front surface that cover the cooling fan, and an intake port and an exhaust port for the cooling fan to perform intake and exhaust are provided on a surface of the fan accommodation portion different from the upper surface.

14 Claims, 15 Drawing Sheets

(56) References Cited

U.S. PATENT DOCUMENTS

| | | | |
|---|---|---|---|
| 2006/0290893 A1 | 12/2006 | Lim et al. | |
| 2008/0074509 A1* | 3/2008 | Sano | H04N 23/50 348/231.3 |
| 2009/0016710 A1* | 1/2009 | Nozaki | H04N 23/50 348/E5.025 |
| 2010/0059211 A1 | 3/2010 | Li et al. | |
| 2014/0307088 A1 | 10/2014 | DeJesus et al. | |
| 2016/0295095 A1 | 10/2016 | Jannard et al. | |
| 2017/0070681 A1 | 3/2017 | Nattress | |
| 2017/0346996 A1 | 11/2017 | Kida | |
| 2018/0054542 A1* | 2/2018 | Petty | G02B 7/008 |
| 2018/0084194 A1 | 3/2018 | Woodman et al. | |
| 2019/0335075 A1 | 10/2019 | Ueda et al. | |
| 2020/0036852 A1* | 1/2020 | Petty | G02B 7/028 |
| 2020/0110449 A1* | 4/2020 | Chang | H05K 7/20172 |
| 2020/0120250 A1* | 4/2020 | Colin | H05K 7/20145 |
| 2020/0288048 A1 | 9/2020 | Makara et al. | |
| 2020/0288586 A1 | 9/2020 | Lu et al. | |
| 2021/0055631 A1* | 2/2021 | Mano | H05K 7/20418 |
| 2021/0153381 A1 | 5/2021 | Naito et al. | |
| 2021/0181599 A1* | 6/2021 | Shum | G03B 17/12 |
| 2021/0302057 A1 | 9/2021 | Lozano | |
| 2021/0306538 A1 | 9/2021 | Solar | |
| 2022/0030150 A1* | 1/2022 | Obana | H05K 1/0209 |
| 2022/0294954 A1 | 9/2022 | Ishii et al. | |
| 2022/0294955 A1* | 9/2022 | Yoshida | G03B 17/561 |
| 2022/0294956 A1 | 9/2022 | Tamura et al. | |
| 2023/0035644 A1* | 2/2023 | Kuroki | H05K 7/2039 |
| 2023/0266645 A1* | 8/2023 | Ueda | G03B 17/55 348/207.99 |
| 2023/0320048 A1 | 10/2023 | Jang et al. | |

FOREIGN PATENT DOCUMENTS

| | | | | |
|---|---|---|---|---|
| JP | 2013-175959 | A | | 9/2013 |
| JP | 2014-081504 | A | | 5/2014 |
| JP | 2019-057887 | A | | 4/2019 |
| JP | 2019-179949 | A | | 10/2019 |
| JP | 2019191433 | A | * | 10/2019 ............. H04N 23/50 |
| WO | 2015/025687 | A1 | | 2/2015 |

OTHER PUBLICATIONS

Office Action for related U.S. Appl. No. 17/877,131, filed Feb. 15, 2024.

Commonly owned, co-pending U.S. Appl. No. 17/877,131, filed Jul. 29, 2022.

Office Action for related U.S. Appl. No. 17/877,131, filed Sep. 16, 2024.

Office Action for related U.S. Appl. No. 17/877,131, filed Jun. 27, 2024.

Office Action for related Japanese Application No. 2021-126849 dated Jan. 7, 2025 and its English Machine Translation.

\* cited by examiner

IMAGING DEVICE WITH UPPER MOUNTED FAN ACCOMMODATION PORTION

TECHNICAL FIELD

Field of the Invention

The present disclosure relates to an imaging device that captures an image of a subject.

BACKGROUND

Japanese Patent Laid-open Publication No. 2019-057887 discloses an imaging device that captures an image of the subject. The imaging device of Japanese Patent Laid-open Publication No. 2019-057887 includes heat sources such as an image sensor and an image engine, and various heat dissipation mechanisms for dissipating heat generated from these heat sources have been proposed.

SUMMARY

With the recent trend of higher image quality and higher performance and the use of moving images, the heat generated by the heat sources such as the image sensor and the image engine tends to increase significantly. While stop of operation of the imaging device due to overheating is likely to be a problem, various members such as a heat sink and a fan are required for the heat dissipation mechanism capable of dissipating a large amount of heat, and the imaging device tends to be large in size, which may damage designability. There is a case where deterioration of sound characteristics due to noise of a fan becomes a problem. Therefore, there is room for improvement in improving the quality of heat dissipation characteristics while suppressing deterioration of sound characteristics.

The present disclosure provides an imaging device that has improved quality of heat dissipation characteristics while suppressing deterioration of sound characteristics.

An imaging device according to the present disclosure includes: an imaging main body; a fan accommodation portion provided in an upper portion of the imaging main body; and a cooling fan disposed in the fan accommodation portion, in which the fan accommodation portion includes an upper surface, a pair of side surfaces, and a front surface that cover the cooling fan, and an intake port and an exhaust port for the cooling fan to perform intake and exhaust are provided on a surface of the fan accommodation portion different from the upper surface.

According to the imaging device of the present disclosure, it is possible to improve the quality of heat dissipation characteristics while suppressing deterioration of sound characteristics.

DETAILED DESCRIPTION

Hereinafter, embodiments will be described in detail with reference to the drawings as appropriate. However, unnecessarily detailed description may be omitted. For example, a detailed description of a well-known matter and a repeated description of substantially the same configuration may be omitted. This is to avoid unnecessary redundancy of the following description and to facilitate understanding of those skilled in the art. Note that the inventors provide the accompanying drawings and the following description in order for those skilled in the art to fully understand the present disclosure, and do not intend to limit the subject matter described in the claims by the accompanying drawings and the following description.

First Embodiment

In a first embodiment, a digital camera will be described as an example of an imaging device according to the present disclosure.

A configuration of an imaging device 2 according to the first embodiment will be described with reference to FIGS. 1 to 7. Hereinafter, a left-right direction as viewed from a user using the imaging device 2 is defined as an X-axis direction, a front-rear direction is defined as a Y-axis direction, and an up-down direction is defined as a Z-axis direction. With respect to the direction in a self-sustained state of the imaging device 2, terms indicating directions such as "upper", "lower", "front", "rear", "left", and "right" are used, which does not mean to limit a use state of the imaging device of the present disclosure.

Figure 1:
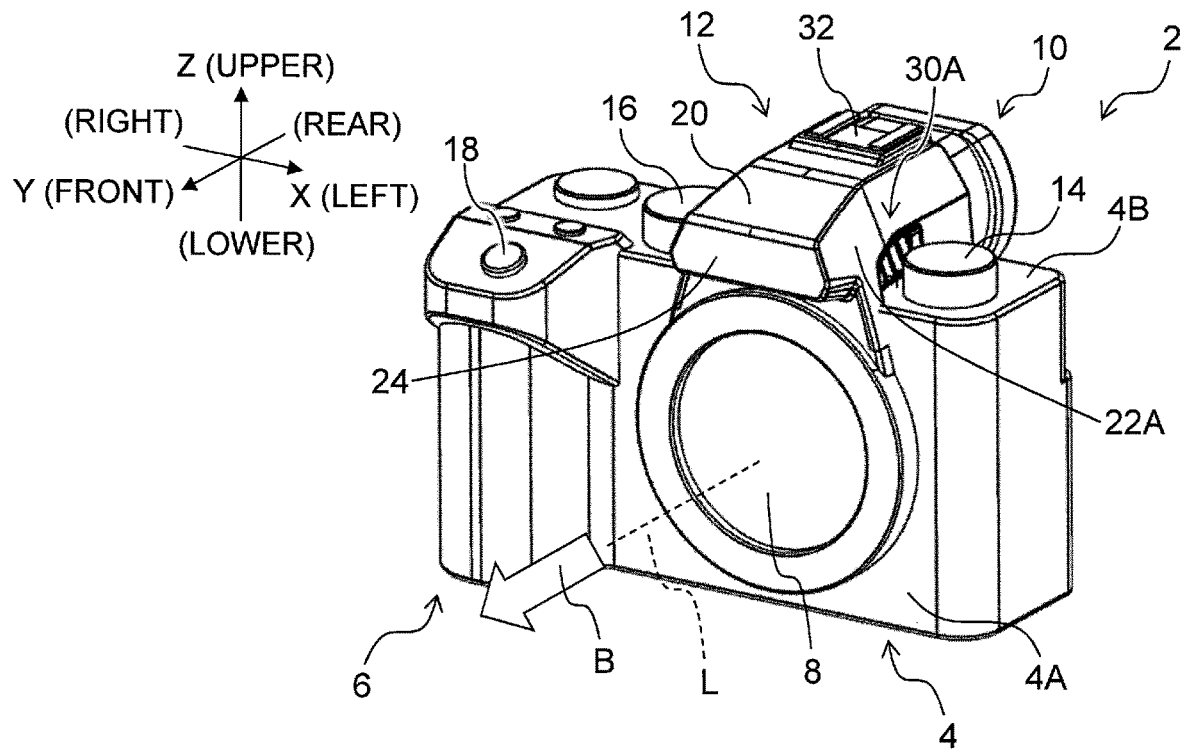
FIG. 1 is a perspective view of an imaging device according to a first embodiment of the present disclosure.
Figure 2:
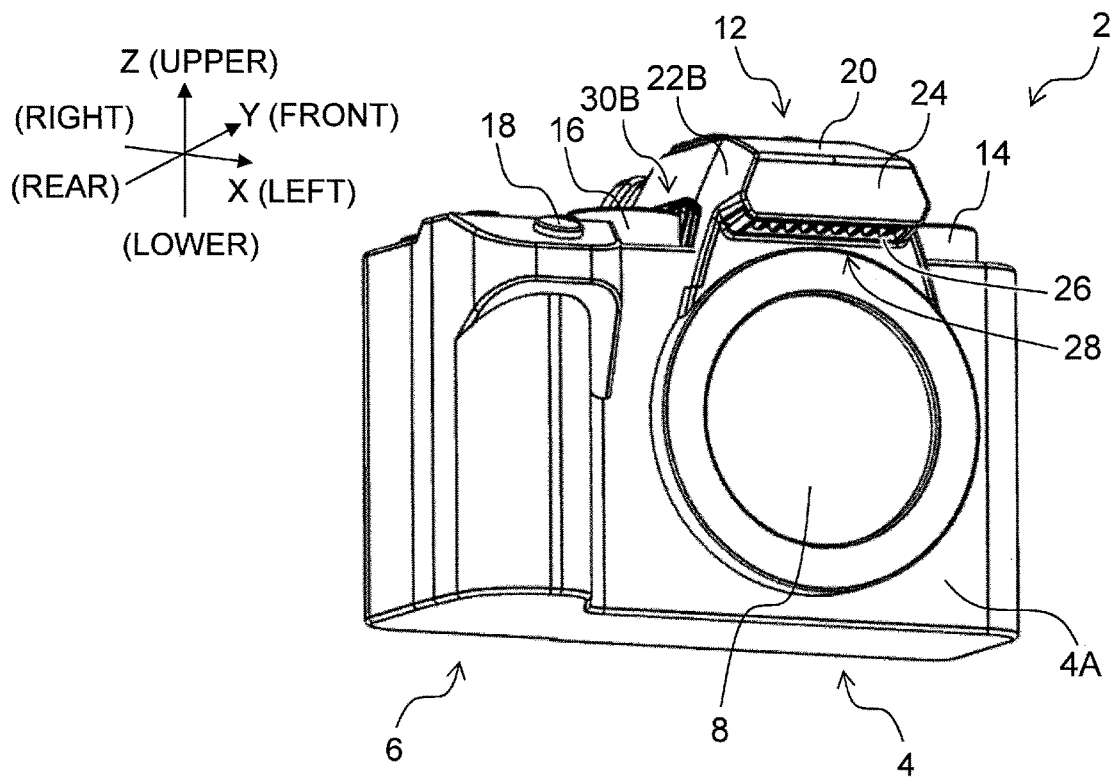
FIG. 2 is a perspective view of the imaging device according to the first embodiment.
Figure 3:
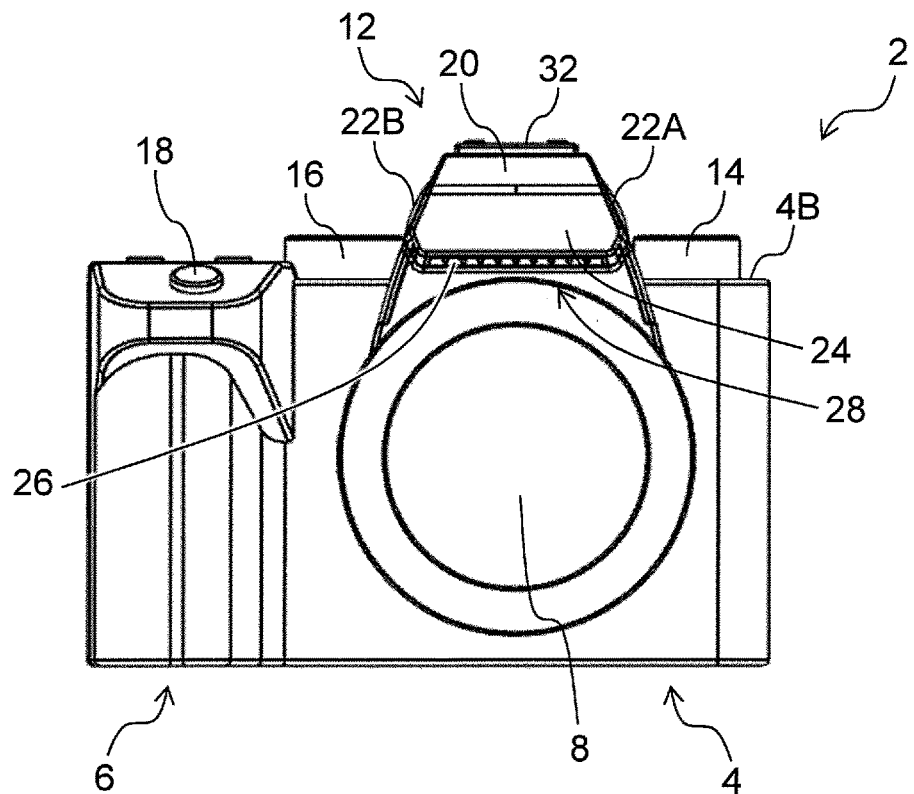
FIG. 3 is a front view of the imaging device according to the first embodiment.
Figure 4:
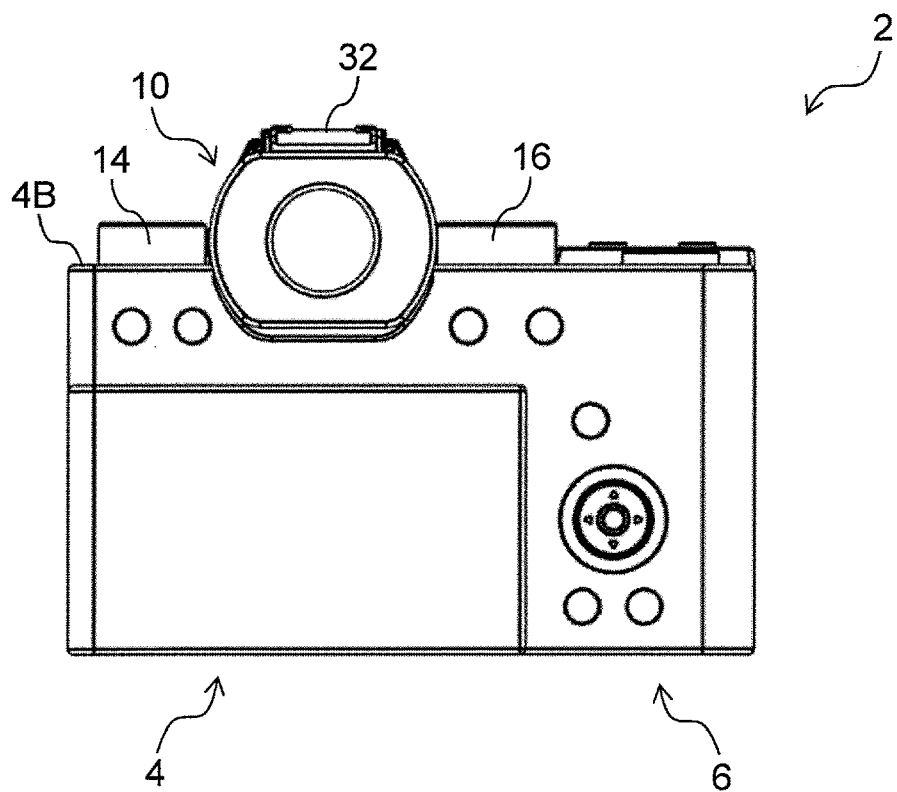
FIG. 4 is a rear view of the imaging device according to the first embodiment.
Figure 5:
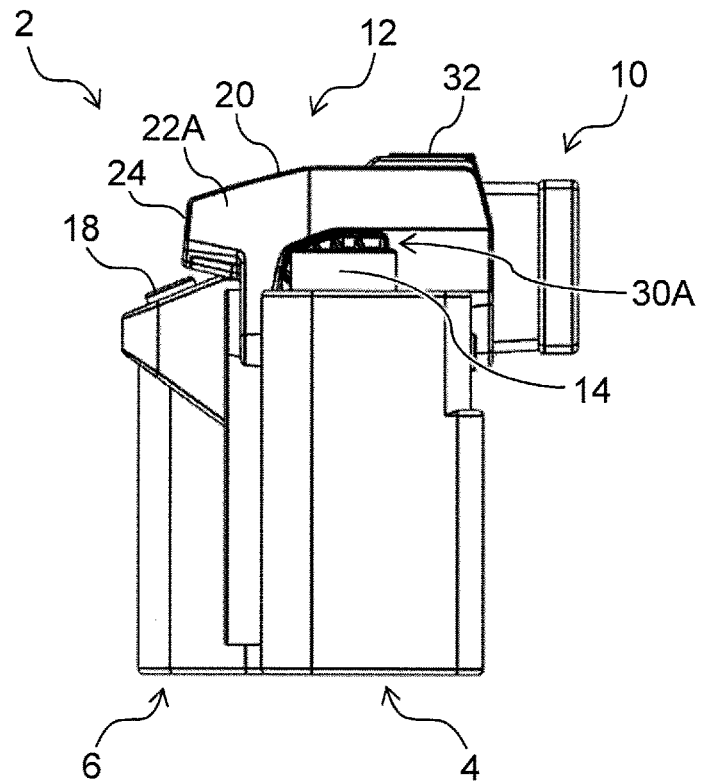
FIG. 5 is a side view of the imaging device according to the first embodiment.
Figure 6:
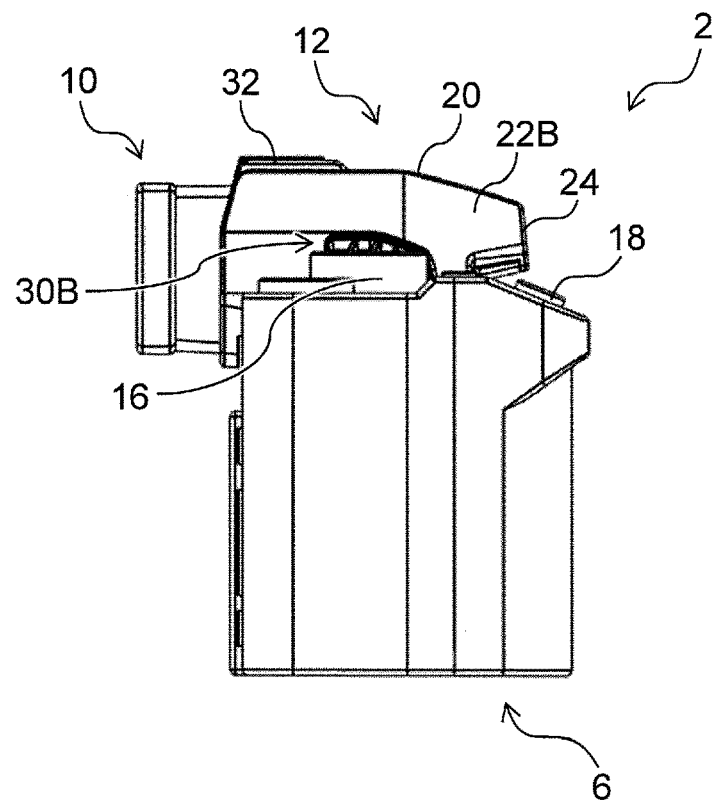
FIG. 6 is a side view of the imaging device according to the first embodiment.
Figure 7:
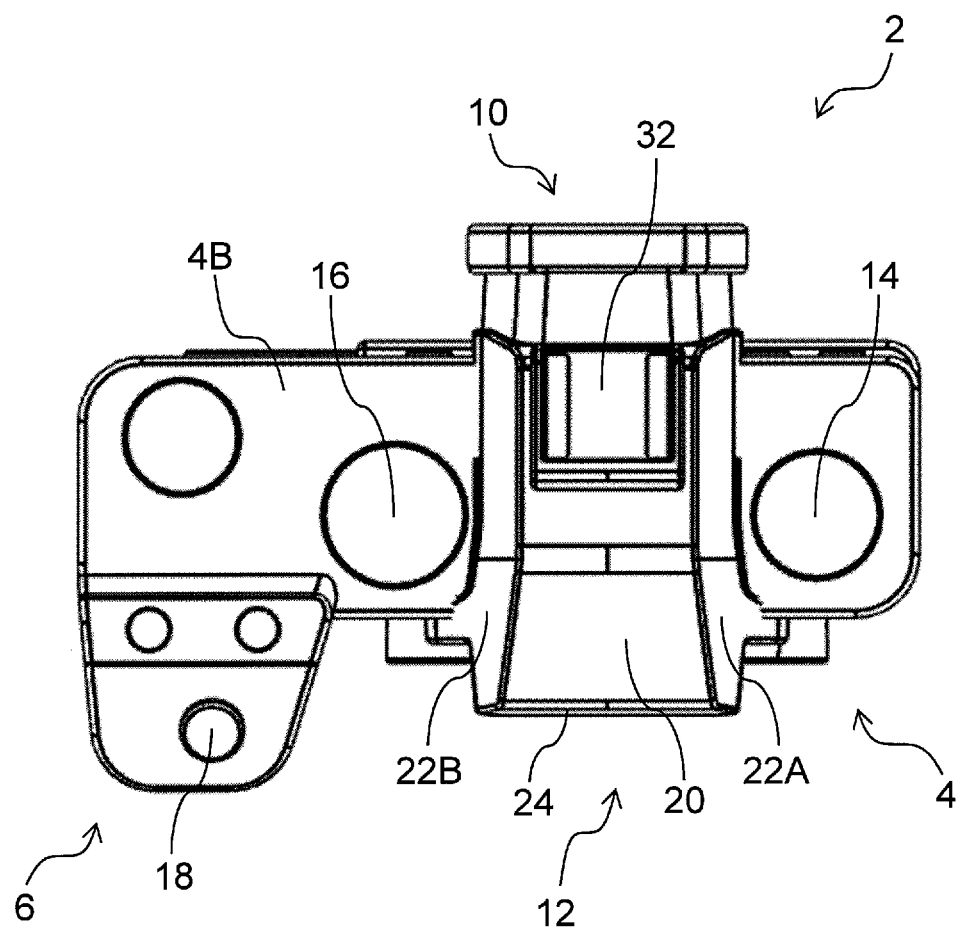
FIG. 7 is a plan view of the imaging device according to the first embodiment.

FIGS. 1 and 2 are perspective views of the imaging device 2 according to the first embodiment, FIG. 3 is a front view of the imaging device 2, FIG. 4 is a rear view of the imaging device 2, FIGS. 5 and 6 are side views of the imaging device 2, and FIG. 7 is a plan view of the imaging device 2.

The imaging device 2 illustrated in FIGS. 1 to 7 includes an imaging main body 4 and a grip portion 6.

The imaging main body 4 is a portion for capturing an image of a subject using a lens (not illustrated). The imaging main body 4 incorporates various components including a heat source such as an image sensor and an image engine, and captures, toward an imaging direction B (Y-axis direction) along an optical axis L, an image of a subject (not illustrated) positioned on the front side.

The grip portion 6 is a portion for the user to grip the imaging device 2. The grip portion 6 is provided on a side (right side in the first embodiment) with respect to the imaging main body 4. An upper surface of the grip portion 6 is provided with a release button 18. The grip portion 6 of the first embodiment is formed integrally with the imaging main body 4, but may be detachable.

The imaging main body 4 includes a lens cap 8, an electronic view finder (EVF) unit 10, a penta portion 12, and dials 14 and 16.

The lens cap 8 is a member that covers a lens attachment portion (not illustrated) for attaching an interchangeable lens. The lens cap 8 is provided on a front surface 4A of the imaging main body 4. Various lenses can be attached to the lens attachment portion covered by the lens cap 8.

The EVF unit 10 is a unit that displays, in a finder, an image (through-the-lens image) captured by the imaging device 2. The EVF unit 10 is provided above the imaging main body 4 and protrudes rearward.

The penta portion 12 is provided above the imaging main body 4 and protrudes forward. The penta portion 12 is an example of a "protrusion". In a case where the imaging device 2 is single-lens reflex, a pentaprism (not illustrated) that is an optical system of the finder is accommodated in the penta portion 12. In a case where the imaging device 2 is mirrorless, no pentaprism is accommodated in the penta portion 12. In the present description, the "protrusion" is referred to as penta portion 12 regardless of whether or not the pentaprism is included. A heat dissipation mechanism 36 (FIG. 10) including a cooling fan 38 described later is accommodated in the penta portion 12 of the first embodiment. The penta portion 12 is an example of a "fan accommodation portion" that accommodates the cooling fan 38, and functions as a case and a cover.

Figure 9:
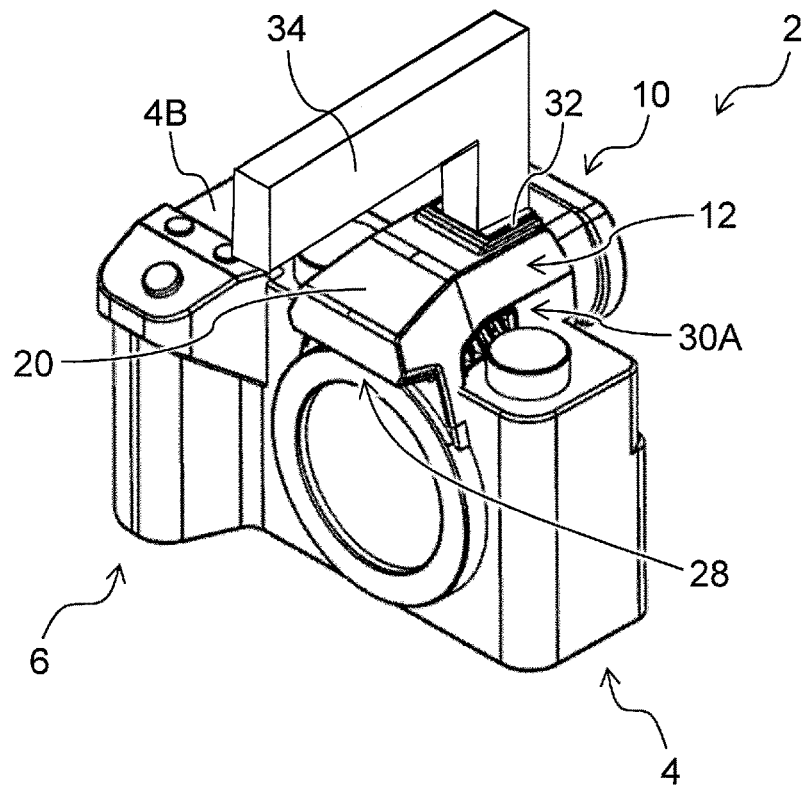
FIG. 9 is a perspective view (a view illustrating an attachment state of an external microphone) of the imaging device according to the first embodiment.

The penta portion 12 of the first embodiment has an upper surface 20, a pair of side surfaces 22A and 22B, a front surface 24, and a lower surface 26. As illustrated in FIG. 1 and the like, the upper surface 20 of the penta portion 12 is provided with an accessory shoe 32. The accessory shoe 32 can be attached with external equipment such as an external microphone 34 (FIG. 9). The accessory shoe 32 may be referred to as "hot shoe".

As illustrated in FIGS. 1 and 2, the front surface 24 of the penta portion 12 is at a position protruding forward with respect to the front surface 4A of the imaging main body 4. The lower surface 26 is formed so as to connect the front surface 24 of the penta portion 12 and the front surface 4A of the imaging main body 4.

The penta portion 12 further forms an intake port 28 (FIG. 2 and the like) and exhaust ports 30A and 30B (FIGS. 1, 2, and the like) as components of the heat dissipation mechanism 36.

The intake port 28 is an opening for sucking air into the penta portion 12. The exhaust ports 30A and 30B are openings for discharging the air sucked from the intake port 28 to the outside of the penta portion 12. In the first embodiment, the intake port 28 is provided on the lower surface 26 of the penta portion 12, and the exhaust ports 30A and 30B are provided on the side surfaces 22A and 22B of the penta portion 12, respectively.

Figure 8:
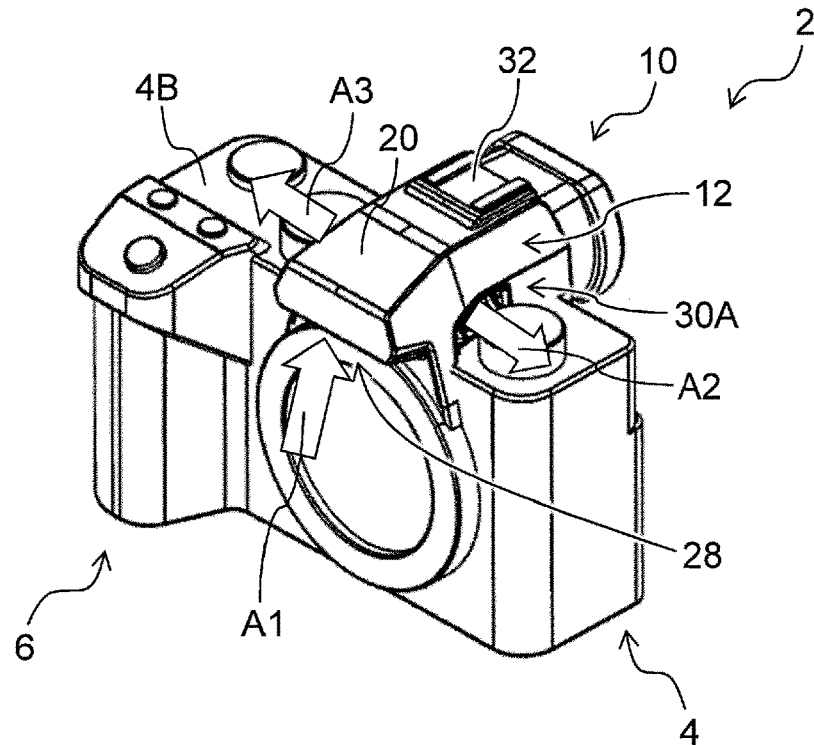
FIG. 8 is a perspective view (a view illustrating a flow of air) of the imaging device according to the first embodiment.

When the cooling fan 38 is operated in the above configuration, as illustrated in FIG. 8, a flow is generated in which air is sucked from the front side of the penta portion 12 through the intake port 28 (arrow A1) and air is discharged to the side of the penta portion 12 through the exhaust ports 30A and 30B (arrows A2 and A3). This makes it possible to cool various heat sources built in the imaging main body 4.

As illustrated in FIGS. 1, 2, and the like, the side surfaces 22A and 22B and the lower surface 26 of the penta portion 12 are provided with openings for intake and exhaust, whereas the upper surface 20 and the front surface 24 are not provided with openings for intake and exhaust. According to such configuration, in a state where the external microphone 34 is attached to the accessory shoe 32 as illustrated in FIG. 9, the distance from the external microphone 34 to the intake and exhaust openings (intake port 28, exhaust ports 30A and 30B) becomes long, and therefore it is possible to make the operation sound of the cooling fan 38 difficult to be collected by the external microphone 34. In the example illustrated in FIG. 9, the external microphone 34 is positioned immediately above the upper surface 20 of the penta portion 12 and extends in the front-rear direction (Y-axis direction). The intake port 28 and the exhaust ports 30A and 30B are not open in a direction facing the external microphone 34. This makes it possible to suppress deterioration in sound collection quality of the external microphone 34 as compared with a configuration in which the upper surface 20 and the front surface 24 are provided with openings for intake and exhaust, leading to improvement in quality of the imaging device 2.

The dials 14 and 16 are members for the user to perform a dial operation, and are erected on an upper surface 4B of the imaging main body 4. The dial 14 is provided at a position overlapping the exhaust port 30A when the imaging device 2 is viewed from the side (left side) as illustrated in FIG. 5, and the dial 16 is provided at a position overlapping the exhaust port 30B when the imaging device 2 is viewed from the side (right side) as illustrated in FIG. 6. By providing the dials 14 and 16 at positions overlapping the exhaust ports 30A and 30B, it becomes difficult for the exhaust ports 30A and 30B to be visually recognized from the outside. This makes it possible to achieve designability of the imaging device 2 while providing the penta portion 12 with the exhaust ports 30A and 30B.

There is a gap between the exhaust ports 30A and 30B and the dials 14 and 16, and therefore the air discharged from the exhaust ports 30A and 30B hits the dials 14 and 16, respectively, and is discharged to the outside from an empty space. It is difficult for a finger to enter the gap, and therefore there is an effect of suppressing the user from erroneously blocking the exhaust ports 30A and 30B.

Next, the heat dissipation mechanism 36 accommodated in the penta portion 12 will be described with reference to FIGS. 10 to 16.

Figure 10:
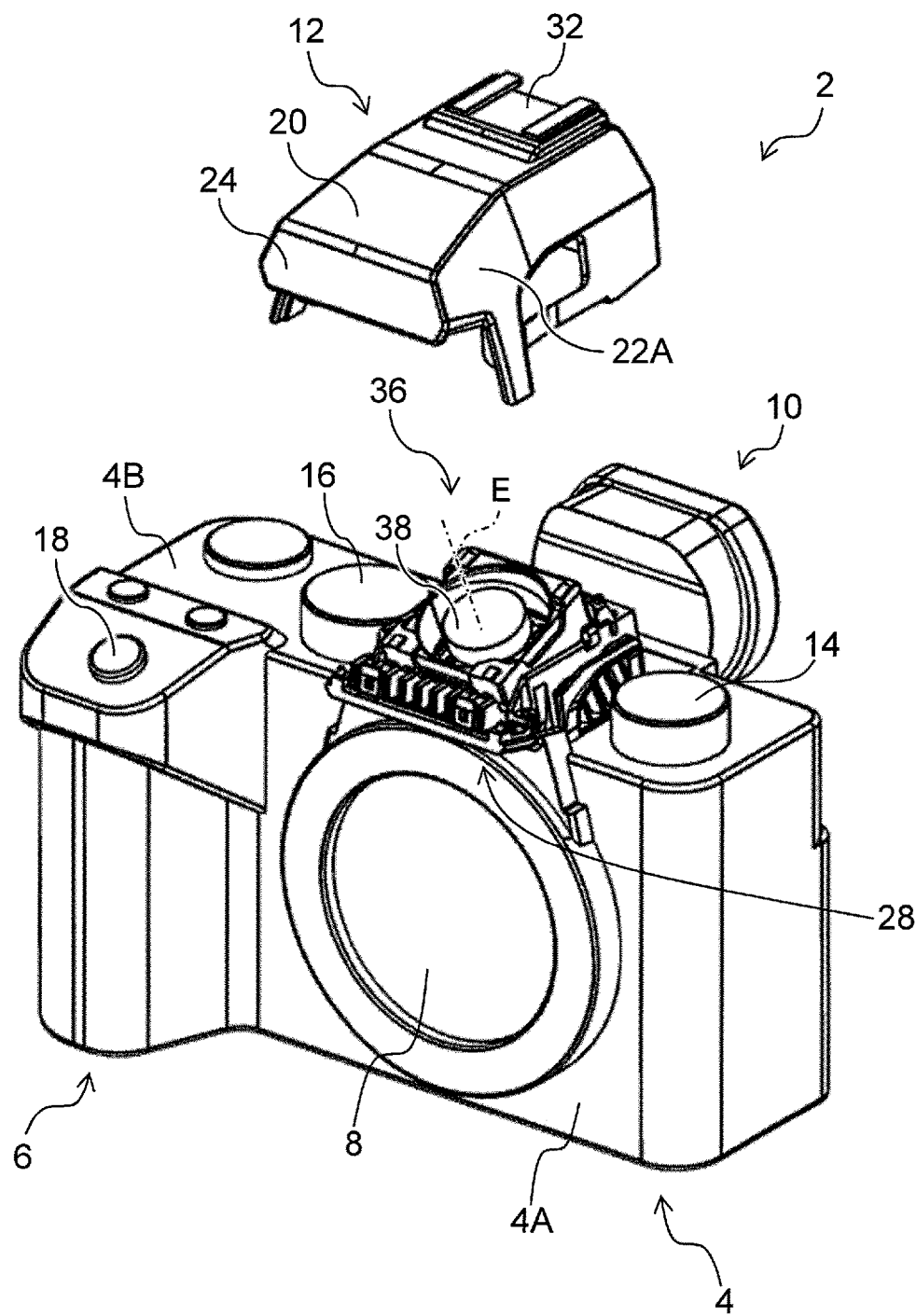
FIG. 10 is a perspective view of the imaging device illustrating a state in which a heat dissipation mechanism according to the first embodiment is exposed.
Figure 11:
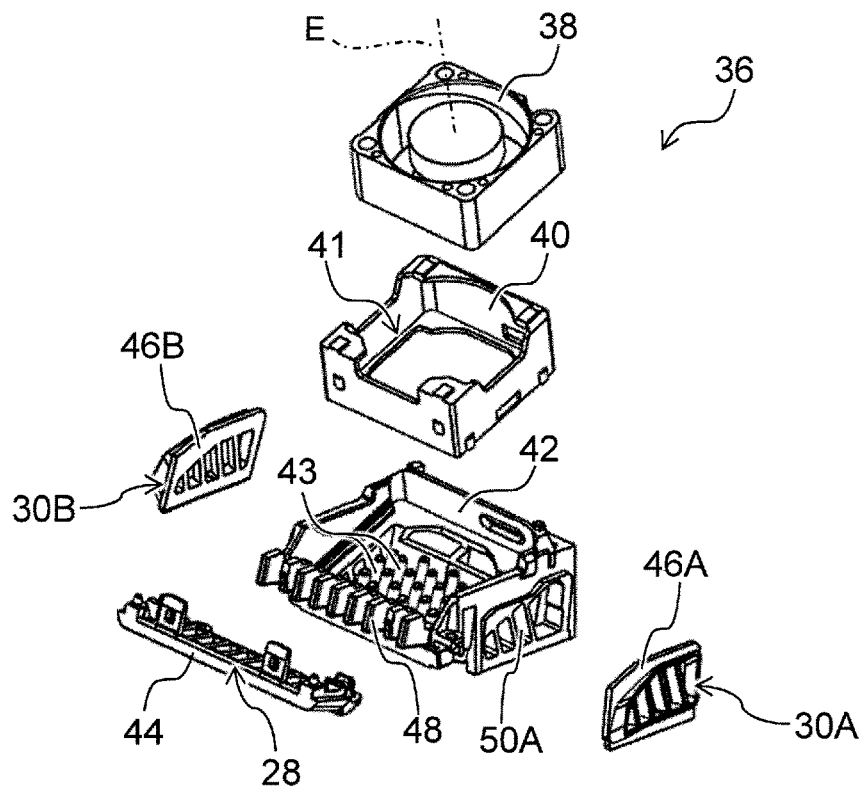
FIG. 11 is an exploded perspective view of the heat dissipation mechanism according to the first embodiment.
Figure 12:
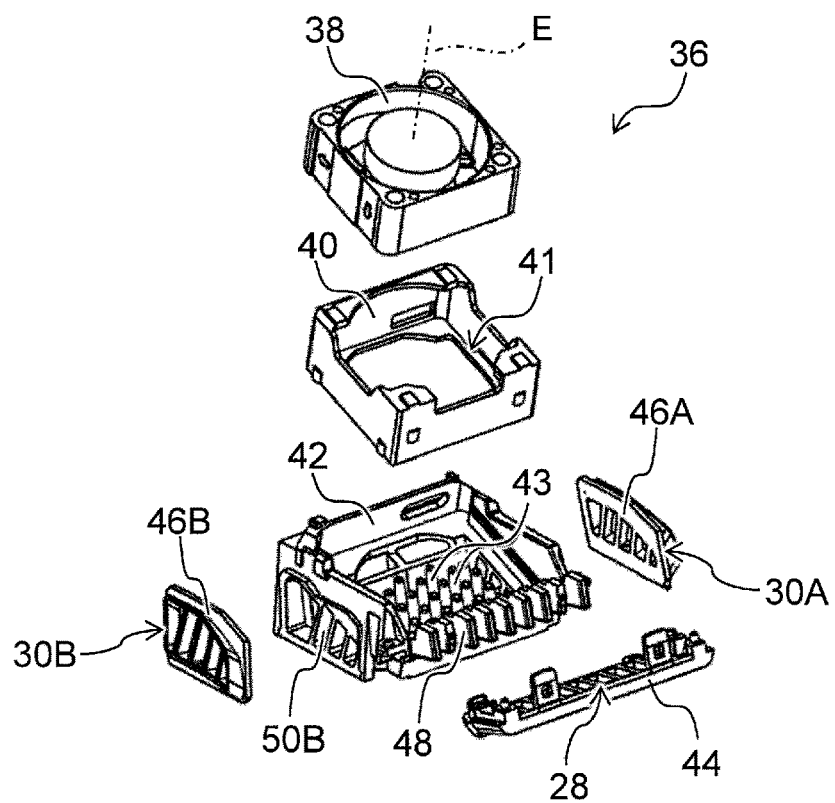
FIG. 12 is an exploded perspective view of the heat dissipation mechanism according to the first embodiment.
Figure 13:
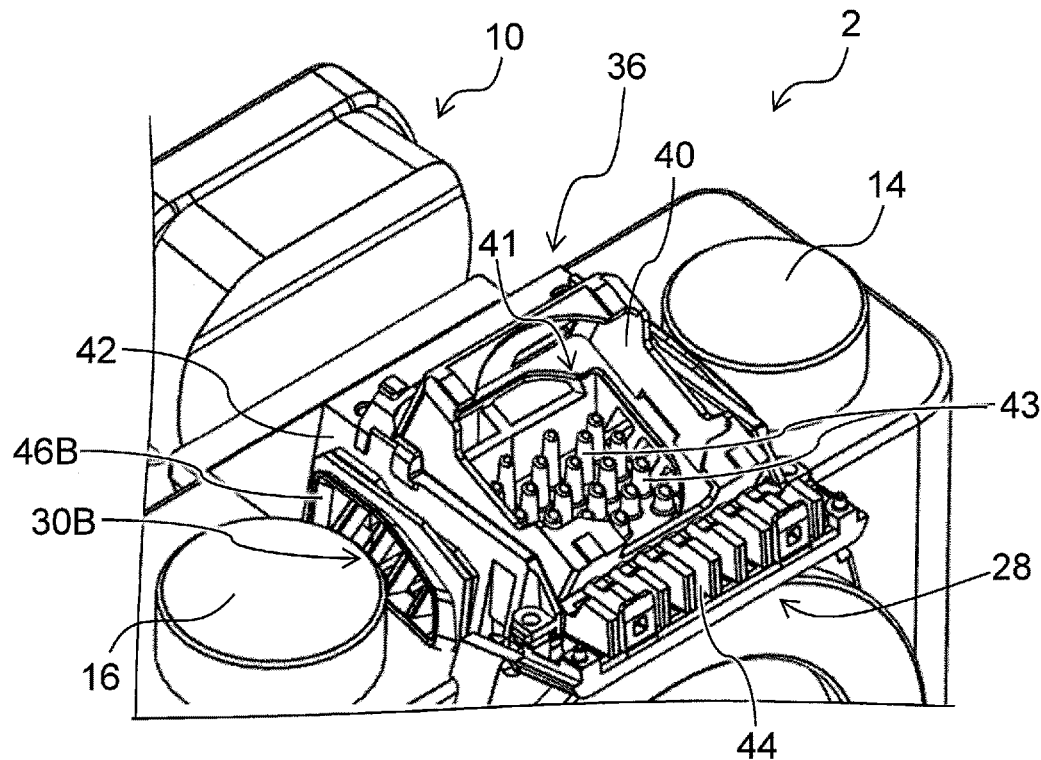
FIG. 13 is an enlarged perspective view illustrating a state in which the cooling fan is removed from the heat dissipation mechanism according to the first embodiment.
Figure 14:
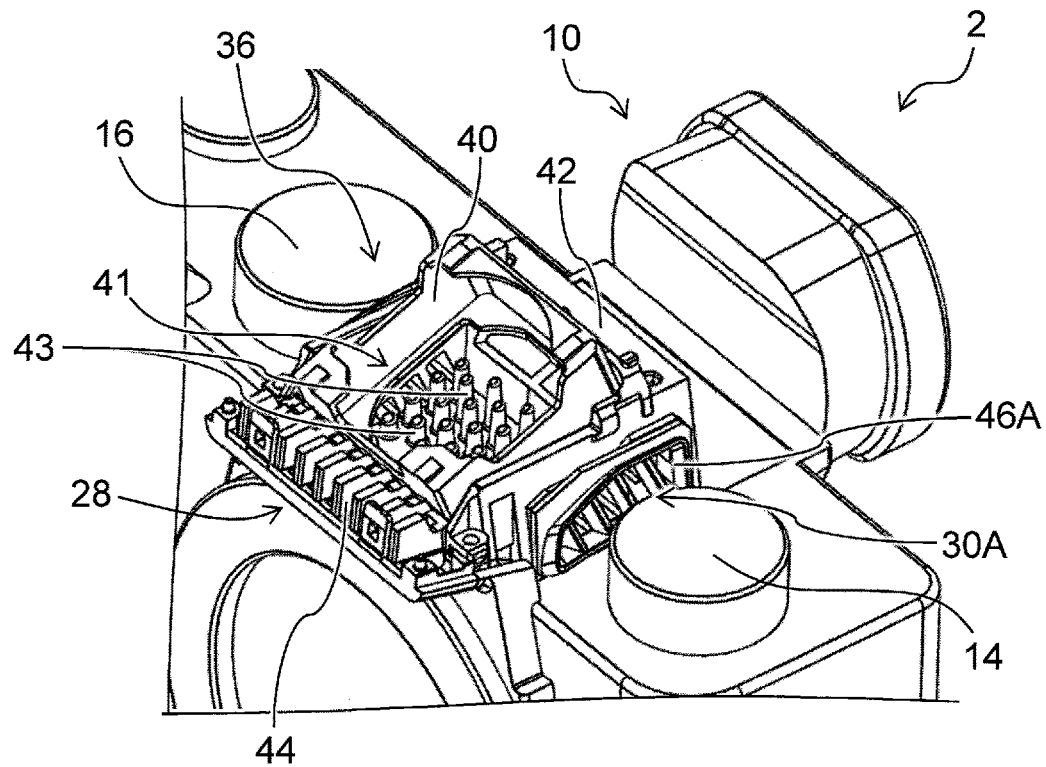
FIG. 14 is an enlarged perspective view illustrating a state in which the cooling fan is removed from the heat dissipation mechanism according to the first embodiment.
Figure 15:
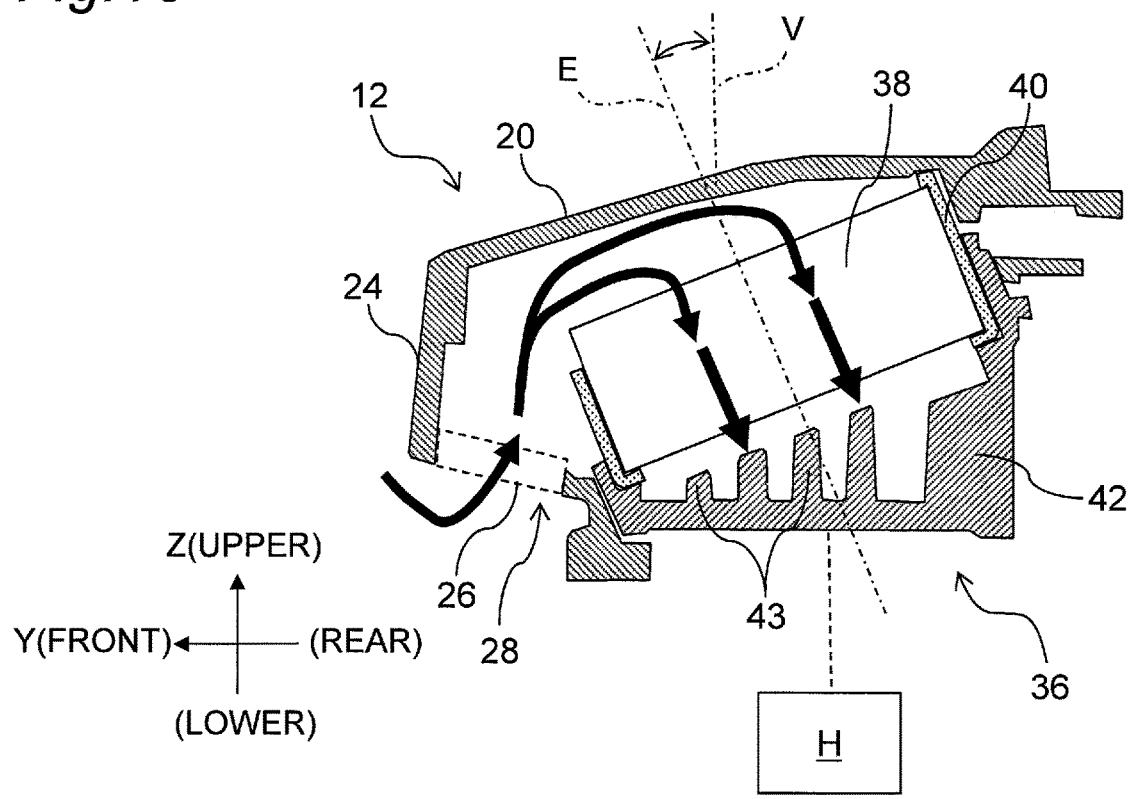
FIG. 15 is a longitudinal sectional view illustrating a schematic configuration of the heat dissipation mechanism according to the first embodiment.
Figure 16:
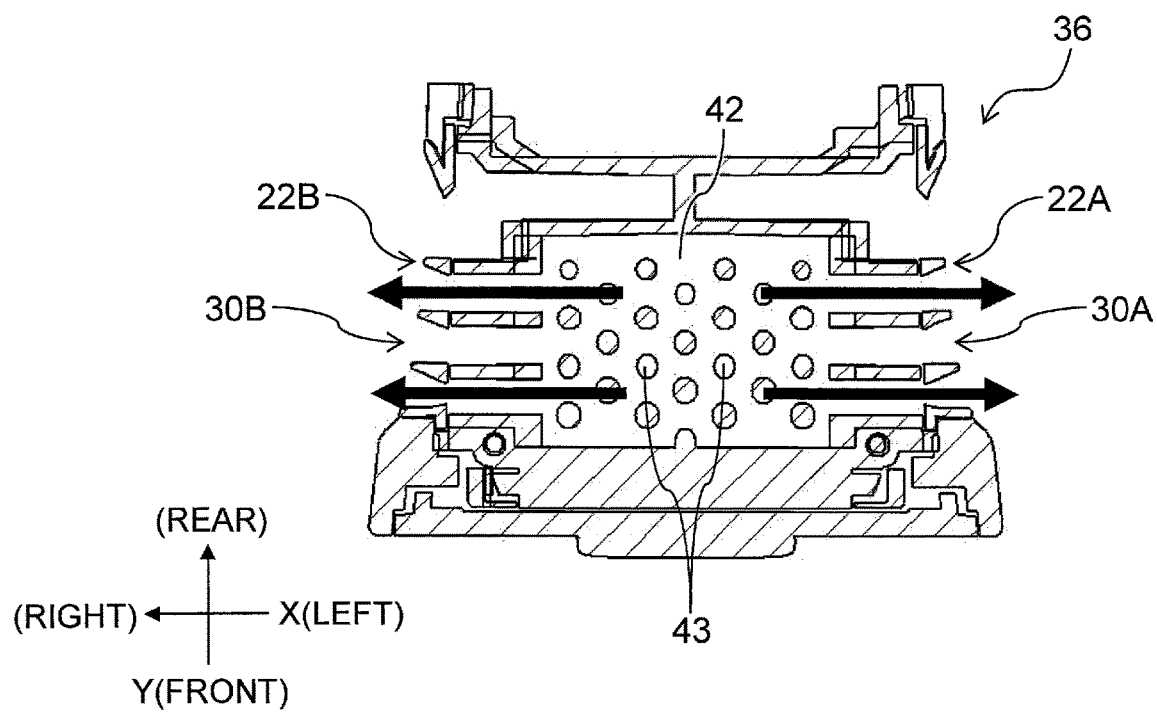
FIG. 16 is a transverse sectional view illustrating a schematic configuration of the heat dissipation mechanism according to the first embodiment.

FIG. 10 is a perspective view of the imaging device 2 illustrating a state in which the penta portion 12 is removed to expose the heat dissipation mechanism 36, FIGS. 11 and 12 are exploded perspective views of the heat dissipation mechanism 36, and FIGS. 13 and 14 are enlarged perspective views illustrating a state in which the cooling fan 38 is removed from the heat dissipation mechanism 36. FIGS. 15 and 16 are a longitudinal sectional view and a transverse sectional view, respectively, illustrating a schematic configuration of the heat dissipation mechanism 36.

As illustrated in FIG. 10, the heat dissipation mechanism 36 accommodated in the penta portion 12 is disposed in the upper portion of the imaging main body 4, and includes, in addition to the cooling fan 38, an attachment member 40, a heat sink 42, an intake cover 44, and two exhaust covers 46A and 46B as illustrated in FIGS. 11 and 12.

The cooling fan 38 is a fan for cooling a heat source H (FIG. 15) such as an image sensor, an image engine, and the like. By blowing air to the heat sink 42 to dissipate heat from the heat sink 42, the cooling fan 38 indirectly cools the heat source H connected to the heat sink 42.

The cooling fan 38 of the first embodiment is an "axial fan" that allows air to flow in a direction along a central axis E. In the attachment state illustrated in FIG. 10, the cooling fan 38 sucks air from above and discharges the air downward.

The attachment member 40 is a member for attaching the cooling fan 38. An opening portion 41 for disposing the cooling fan 38 is formed in a central portion of the attachment member 40. When the attachment member 40 attached with the cooling fan 38 is accommodated in the heat sink 42, the cooling fan 38 is positioned with respect to the heat sink 42.

The heat sink 42 is a member thermally connected to the heat source H, and has a function of dissipating heat transferred from the heat source H. The heat sink 42 is thermally connected to the heat source H via a heat transfer member (not illustrated) such as graphite.

The heat sink 42 includes a plurality of heat dissipation pins 43. Each of the plurality of heat dissipation pins 43 is a rod-shaped member protruding upward toward the cooling fan 38. As illustrated in FIG. 16, the heat dissipation efficiency is improved by interspersing a large number of the heat dissipation pins 43. It is designed that the air blown out from the cooling fan 38 hits the plurality of heat dissipation pins 43. The heat dissipation pin 43 is not limited to have a pin shape, and may have a rib shape, and may have any shape as long as heat dissipation property is improved. The heat dissipation pin 43 is an example of a "heat dissipation facilitation member".

As illustrated in FIGS. 11, 12, and the like, the heat sink 42 includes an intake cover attachment portion 48 on the front side and exhaust cover attachment portions 50A and 50B on the sides. The intake cover attachment portion 48 is a portion for attaching the intake cover 44, and the exhaust cover attachment portions 50A and 50B are portions for attaching the exhaust covers 46A and 46B, respectively. As an attachment method, an arbitrary attachment method such as screw fastening or claw fitting may be adopted, or may be integrally molded. Both the intake cover attachment portion 48 and the exhaust cover attachment portions 50A and 50B form openings for allowing air to flow.

The intake cover 44 is a member that forms the intake port 28, and is attached to the intake cover attachment portion 48. The intake port 28 of the intake cover 44 communicates with an opening provided in the intake cover attachment portion 48. The intake cover 44 constitutes the lower surface 26 (FIG. 2 and the like) of the above-described penta portion 12. The exhaust covers 46A and 46B are members that form the exhaust ports 30A and 30B, respectively, and are attached to the exhaust cover attachment portions 50A and 50B, respectively. The exhaust ports 30A and 30B of the exhaust covers 46A and 46B communicate with openings provided in the exhaust cover attachment portions 50A and 50B, respectively. The exhaust covers 46A and 46B constitute the side surfaces 22A and 22B, respectively, of the penta portion 12.

According to the above configuration, as illustrated in FIG. 15, by the operation of the cooling fan 38, a flow is generated in which air is sucked upward through the intake port 28 provided in the lower surface 26 of the penta portion 12, goes around toward the upper surface side of the cooling fan 38, flows downward along the central axis E inside the cooling fan 38, and is blown out toward the heat dissipation pin 43 of the heat sink 42. As illustrated in FIG. 16, the air that has come into contact with the plurality of heat dissipation pins 43 and absorbed heat is blown out in the lateral direction (X-axis direction) through the exhaust ports 30A and 30B provided on the side surfaces 22A and 22B of the penta portion 12.

As illustrated in FIG. 15, the cooling fan 38 of the first embodiment is disposed such that the central axis E is inclined with respect to a vertical direction V. More specifically, the central axis E is inclined such that the rear portion of the cooling fan 38 becomes above the front portion. Such arrangement makes it possible to create a space through which air flows on the front side of the cooling fan 38. This allows efficient arrangement to be taken when air is sucked from the lower surface 26 positioned on the front side of the penta portion 12, and an increase in size of the imaging device 2 including the penta portion 12 to be suppressed. Use of an axial fan as the cooling fan 38 can increase the air volume, and can improve heat dissipation property.

The cooling fan 38 illustrated in FIG. 15 is disposed in a so-called "horizontal placement", and intake and exhaust air in a substantially up-down direction. As illustrated in FIG. 15, the "horizontal placement" includes an "oblique placement" in which the central axis E is inclined with respect to the vertical direction V.

Conclusion

According to the above configuration, even when the heat source H such as the image sensor, the image engine, and the like generates a large amount of heat, the heat is efficiently dissipated by the heat dissipation mechanism 36 including the cooling fan 38 and the heat sink 42, and thus it is possible to suppress stop of operation of the imaging device 2 due to overheating. In recent years, the trend of higher image quality and higher performance and the use of moving images have become mainstream, and when a problem of stopping a camera function due to overheating is becoming serious, the imaging device 2 can be an effective solution to such a heat problem and can give the user a sense of security. On the other hand, since the heat dissipation mechanism 36 including the cooling fan 38 is accommodated in the penta portion 12 in the central upper portion of the imaging main body 4 and is disposed in front of the EVF unit 10, it becomes easy to suppress an increase in size of the imaging device 2 and to achieve both heat dissipation property and designability.

In the imaging device 2 of the first embodiment, the intake port 28 is provided in the lower surface 26 of the penta portion 12, the exhaust ports 30A and 30B are provided in the side surfaces 22A and 22B of the penta portion 12, and the upper surface 20 and the front surface 24 of the penta portion 12 are not provided with the intake and exhaust openings. Due to this, as illustrated in FIG. 9, even when the external microphone 34 is attached to the accessory shoe 32 on the upper surface 20 of the penta portion 12, operation sound of the cooling fan 38 is less likely to be collected through the intake and exhaust openings, and deterioration of sound characteristics of the external microphone 34 can be suppressed.

As illustrated in FIGS. 1 to 7 and the like, the intake port 28 and the exhaust ports 30A and 30B are disposed at places that are less likely to be visually recognized from the outside. In particular, the intake port 28 provided on the lower surface 26 of the penta portion 12 is difficult to visually recognize from the outside, and the exhaust ports 30A and 30B provided on the side surfaces 22A and 22B are also difficult to visually recognize from the outside because the dials 14 and 16 overlap in the lateral direction. This makes it possible to achieve designability of the imaging device 2 while providing the penta portion 12 with the intake and exhaust openings.

Operations and Effects

As described above, the imaging device 2 of the first embodiment includes the imaging main body 4, the penta portion 12 (corresponding to fan accommodation portion) provided in the upper portion of the imaging main body 4, and the cooling fan 38 disposed in the penta portion 12. The penta portion 12 includes the upper surface 20 covering the cooling fan 38, the pair of side surfaces 22A and 22B, and the front surface 24. The intake port 28 and the exhaust ports 30A and 30B for the cooling fan 38 to perform intake and exhaust are provided on surfaces (for example, side surfaces 22A and 22B and lower surface 26) of the penta portion 12 different from the upper surface 20.

According to such configuration, when the external microphone 34 is attached to the upper portion of the imaging device 2, it is difficult for the external microphone 34 to pick up operation sound of the cooling fan 38. It is possible to suppress deterioration of sound characteristics collected by the external microphone 34 as compared with a configuration in which the upper surface 20 of the penta portion 12 is provided with intake and exhaust openings. This makes it possible to suppress deterioration of sound characteristics while improving the quality of heat dissipation characteristics by providing the cooling fan 38.

In the imaging device 2 of the first embodiment, the upper surface 20 and the front surface 24 are not provided with intake and exhaust openings. This makes it possible to improve the designability of the imaging device 2 while making it difficult for the external microphone 34 to pick up operation sound of the cooling fan 38.

In the imaging device 2 of the first embodiment, the penta portion 12 (corresponding to protrusion) provided above the imaging main body 4 to protrude forward is used as a fan accommodation portion that accommodates the cooling fan 38. By accommodating the cooling fan 38 in the penta portion 12, it is possible to suppress an increase in size of the imaging device 2 and to improve designability of the imaging device 2.

The imaging device 2 of the first embodiment further includes the heat sink 42 disposed below the cooling fan 38, and the cooling fan 38 blows out air downward toward the heat sink 42. This makes it possible to efficiently dissipate the heat collected in the heat sink 42.

In the imaging device 2 of the first embodiment, the exhaust ports 30A and 30B are provided on the side surfaces 22A and 22B. This makes it possible to provide the exhaust ports 30A and 30B at positions that are difficult for the user to visually recognize, leading to improvement of designability. In place of the exhaust ports 30A and 30B, the intake ports may be provided on the side surfaces 22A and 22B. That is, at least one of the intake port and the exhaust port may be provided on the side surfaces 22A and 22B.

In the imaging device 2 of the first embodiment, the dials 14 and 16 that overlap the exhaust ports 30A and 30B provided on the side surfaces 22A and 22B when viewed from the side (for example, viewed along X-axis direction) are erected on the imaging main body 4. Due to this, it becomes more difficult for the user to visually recognize the exhaust ports 30A and 30B, and the designability of the imaging device 2 can be improved.

In the imaging device 2 of the first embodiment, the front surface 24 of the penta portion 12 is at a position protruding forward relative to the imaging main body 4, and the intake port 28 is provided on the lower surface 26 connecting the front surface 24 and the front surface 4A of the imaging main body 4. This makes it difficult for the user to visually recognize the intake port 28, and to improve the designability. In place of the intake port 28, the exhaust port may be provided on the lower surface 26. That is, at least one of the intake port and the exhaust port may be provided on the lower surface 26.

In the imaging device 2 of the first embodiment, the lower surface 26 is provided with the intake port 28, and the side surfaces 22A and 22B are provided with the exhaust ports 30A and 30B. This makes it possible to dispose the intake and exhaust openings at positions that are difficult to visually recognize, and to improve the designability of the imaging device 2.

In the imaging device 2 of the first embodiment, the upper surface 20 of the penta portion 12 is provided with the accessory shoe 32. This makes it possible to make the external microphone 34 hardly pick up operation sound of the cooling fan 38 when the external microphone 34 is attached to the accessory shoe 32.

In the imaging device 2 of the first embodiment, the central axis E of the cooling fan 38 is inclined with respect to the vertical direction V. This allows the flow of air by the cooling fan 38 to be variously designed.

In the imaging device 2 of the first embodiment, the central axis E of the cooling fan 38 is inclined such that the rear side of the cooling fan 38 becomes higher than the front side. This makes it possible to achieve efficient arrangement, and easily makes an air path on the front side of the cooling fan 38.

In the imaging device 2 of the first embodiment, the cooling fan 38 is an axial fan. This makes it possible to increase the air volume and improve heat dissipation property.

Modification of First Embodiment

Figure 17:
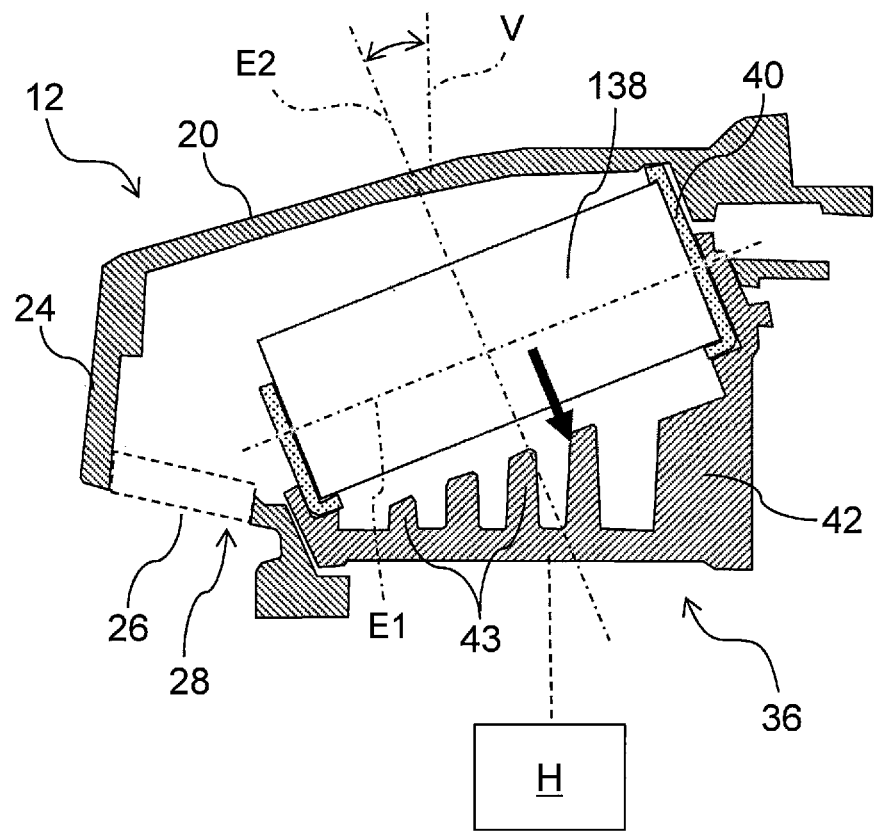
FIG. 17 is a longitudinal sectional view illustrating a schematic configuration of the heat dissipation mechanism according to a modification of the first embodiment.

In the first embodiment, an axial fan is used as the cooling fan 38, but the present invention is not limited to such a case. For example, as illustrated in the modification of FIG. 17, a cooling fan 138 as a centrifugal fan may be provided inside the penta portion 12. The cooling fan 138, which is a centrifugal fan, is disposed horizontally, sucks air along a horizontal axis E1, and blows out the air downward along a vertical axis (central axis) E2 orthogonal to the horizontal axis E1. According to such configuration, similarly to the imaging device 2 of the first embodiment, it is possible to generate a flow in which air is sucked from the intake port 28 provided in the lower surface 26 of the penta portion 12, air is hit to the heat dissipation pin 43 of the heat sink 42, and air is blown out from the exhaust ports 30A and 30B provided in the side surfaces 22A and 22B.

In the first embodiment, one intake port 28 and two exhaust ports 30A and 30B are provided, but the present invention is not limited to such a case, and the number of intake ports and the number of exhaust ports may be any number. The positions of, the intake port and the exhaust port and the orientation of intake and exhaust may be appropriately changed.

Figure 18:
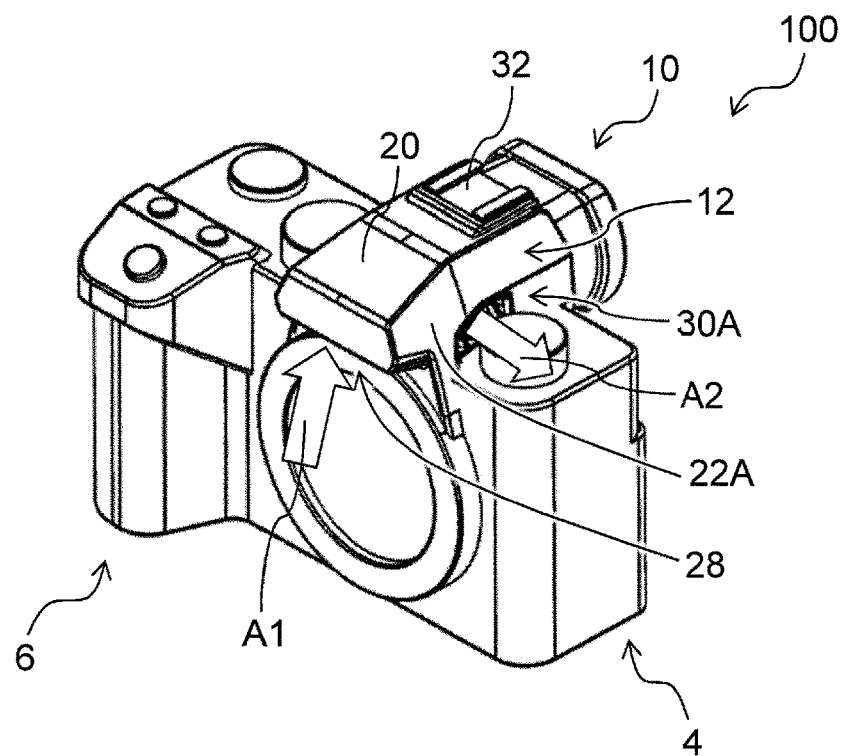
FIG. 18 is a perspective view of an imaging device according to another modification of the first embodiment.
Figure 19:
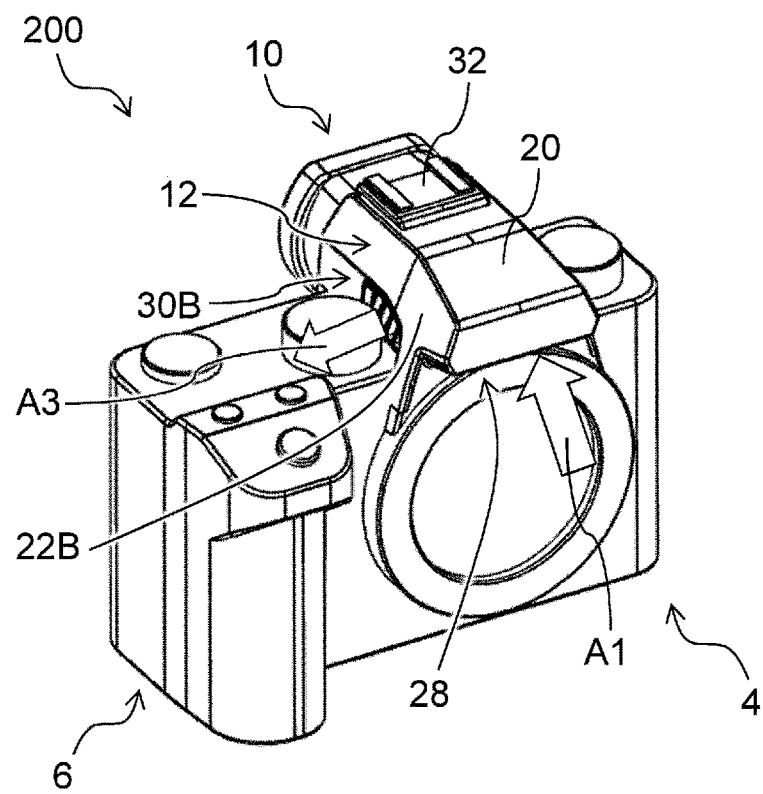
FIG. 19 is a perspective view of an imaging device according to another modification of the first embodiment.

For example, in an imaging device 100 according to the modification of FIG. 18, the side surface 22A is provided with the exhaust port 30A, whereas the opposing side surface 22B is not provided with the exhaust port (there is no flow of arrow A3). In an imaging device 200 according to the modification of FIG. 19, the side surface 22B is provided with the exhaust port 30B, whereas the opposing side surface 22A is not provided with the exhaust port (there is no flow of arrow A2). Also in the configuration illustrated in FIGS. 18 and 19, air can be sucked and discharged by the operation of the cooling fan 38.

Figure 20:
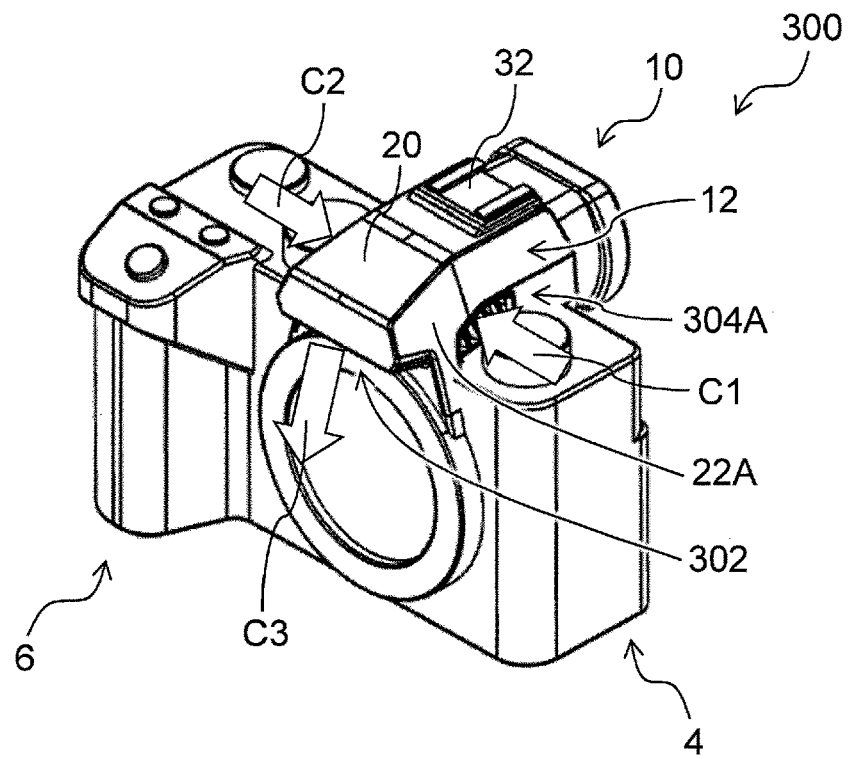
FIG. 20 is a perspective view of an imaging device according to still another modification of the first embodiment.
Figure 21:
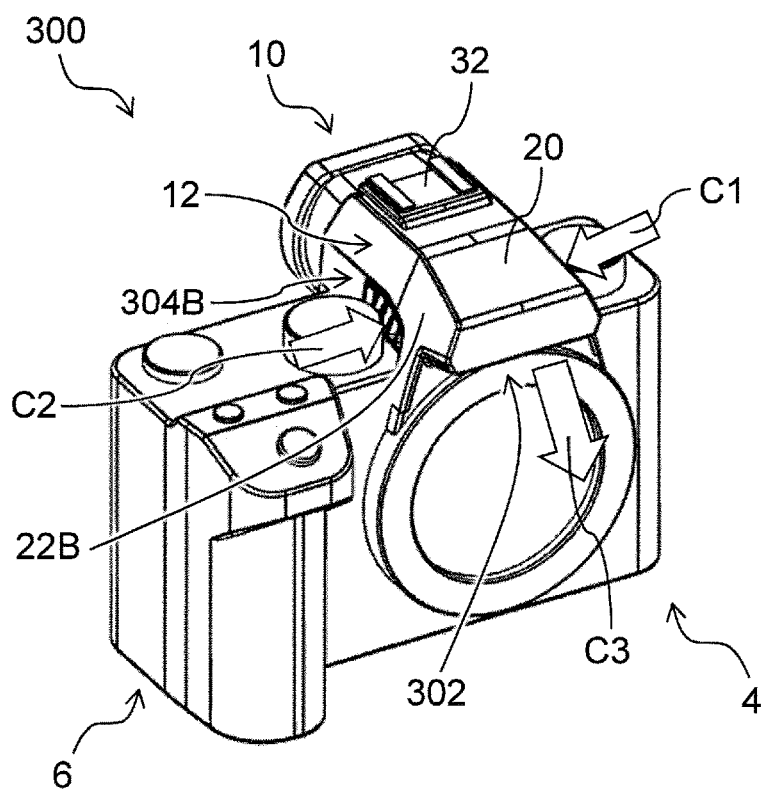
FIG. 21 is a perspective view of an imaging device according to still another modification of the first embodiment.

An imaging device 300 according to still another modification is illustrated in FIGS. 20 and 21. The imaging device 300 illustrated in FIGS. 20 and 21 corresponds to a configuration in which the intake port and the exhaust port are switched in the imaging device 2 of the first embodiment. Specifically, the intake port 28 is changed to an exhaust port 302, and the exhaust ports 30A and 30B are changed to intake ports 304A and 304B. This makes it possible to generate a flow in which air is sucked from the intake ports 304A and 304B (arrow C1 and C2) and air is blown out from the exhaust port 302 (arrow C3).

The intake port and the exhaust port described above are not limited to being always open, and may be provided with a lid that can be opened and closed by the user.

Second Embodiment

An imaging device 400 according to the second embodiment of the present invention will be described with reference to FIGS. 22 to 24. In the second embodiment, points different from the first embodiment will be mainly described. In addition, the same or equivalent components are denoted by the same reference numerals, and description thereof will be omitted.

In the first embodiment, the cooling fans 38 and 138 are in the "horizontal placement" to suck air upward as illustrated in FIGS. 15 and 17 or discharge air downward as illustrated in FIGS. 20 and 21, meanwhile in the second embodiment, the cooling fan is in "vertical placement" to perform intake and exhaust of the air horizontally, which is different from the first embodiment.

Figure 22:
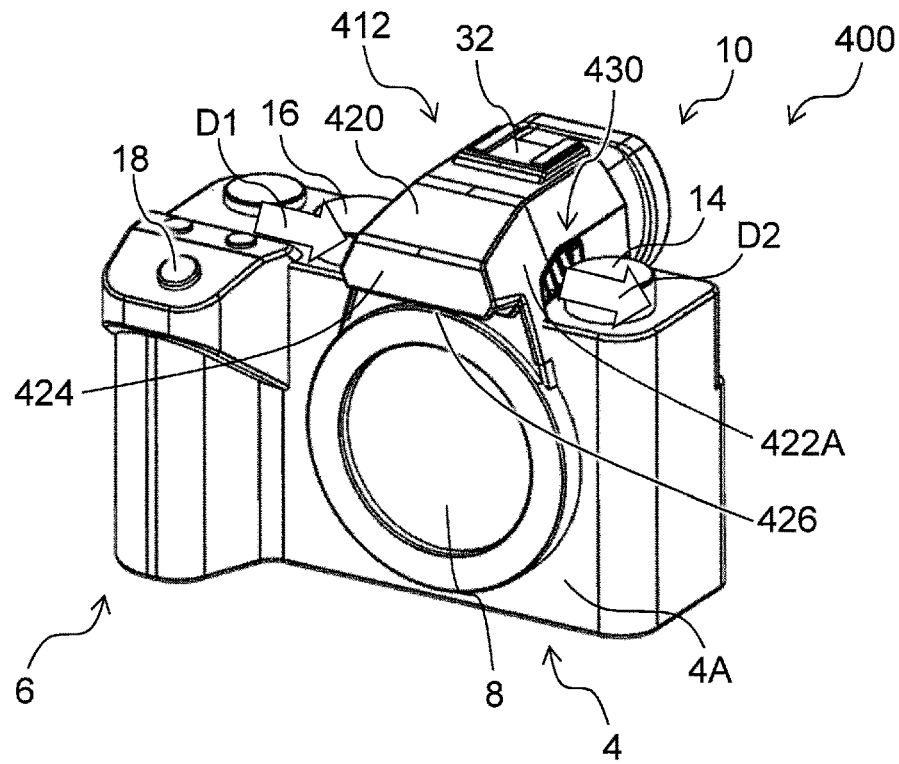
FIG. 22 is a perspective view of an imaging device according to a second embodiment.
Figure 23:
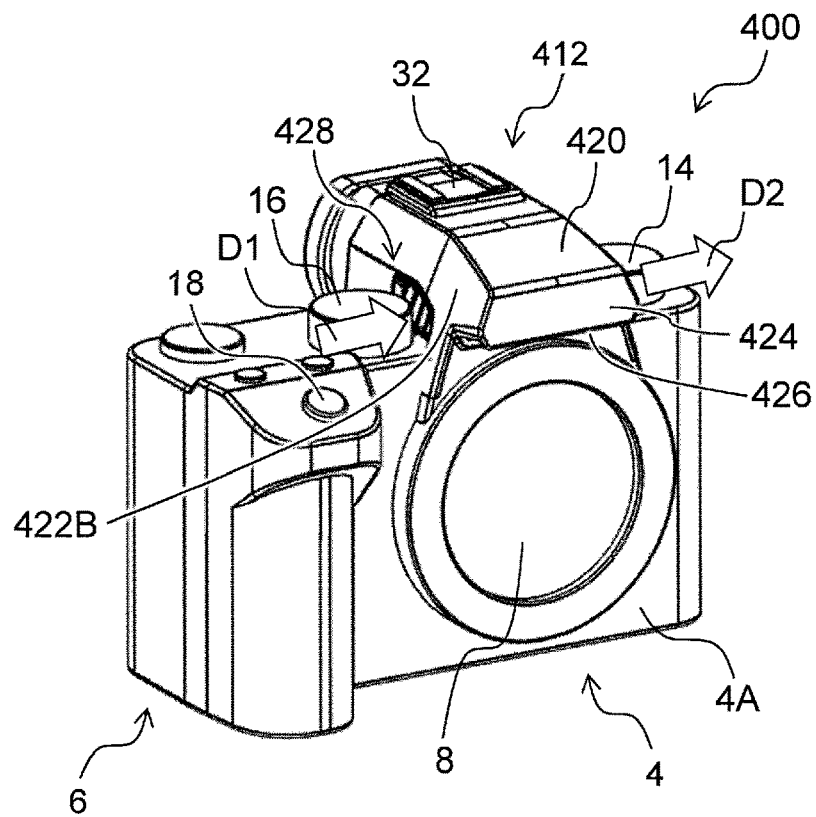
FIG. 23 is a perspective view of the imaging device according to the second embodiment.
Figure 24:
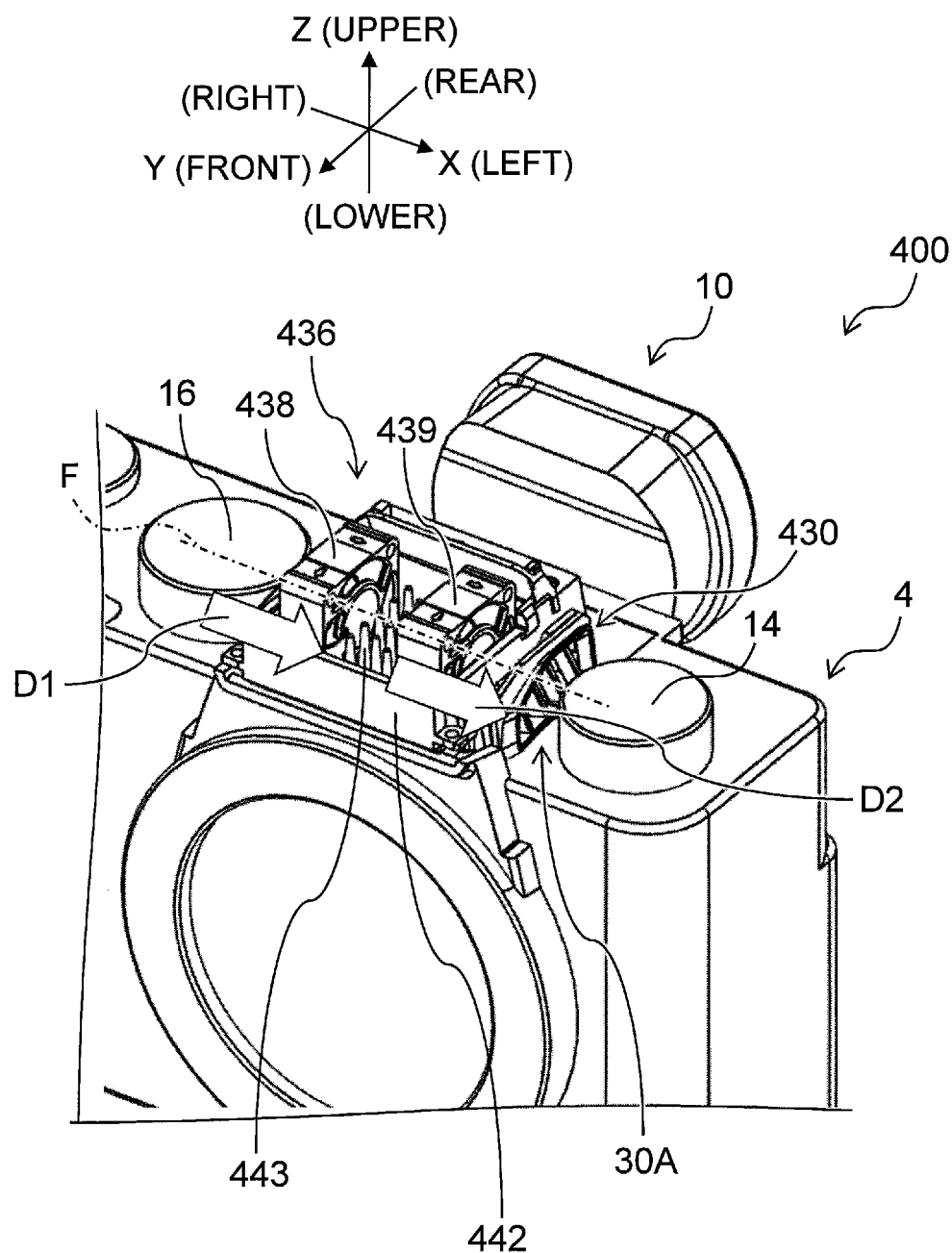
FIG. 24 is an enlarged perspective view illustrating the heat dissipation mechanism provided in the imaging device according to the second embodiment.

FIGS. 22 and 23 are perspective views of the imaging device 400 according to the second embodiment, and FIG. 24 is an enlarged perspective view illustrating a heat dissipation mechanism 436 provided in the imaging device 400.

In the imaging device 400 illustrated in FIGS. 22 and 23, an intake port 428 (FIG. 23) is provided on a side surface 422B of a penta portion 412, and an exhaust port 430 (FIG. 22) is provided in an opposing side surface 422A. This generates a flow in which air is sucked into the penta portion 412 from the intake port 428 (arrow D1) and air is blown out to the outside of the penta portion 412 from the exhaust port 430 (arrow D2).

In the second embodiment, a lower surface 426 of the penta portion 412 is not provided with intake and exhaust openings. Any of the upper surface 420, the front surface 424, and the lower surface 426 of the penta portion 412 are not provided with intake and exhaust openings.

As illustrated in FIG. 24, the heat dissipation mechanism 436 is built in the penta portion 412. The heat dissipation mechanism 436 includes a heat sink 442 and two cooling fans 438 and 439.

The heat sink 442 accommodates the two cooling fans 438 and 439 and incorporates a plurality of heat dissipation pins 443.

Each of the cooling fans 438 and 439 is disposed in vertical placement inside the heat sink 442 and blows air in the lateral direction (X-axis direction) along a central axis F. The cooling fan 438 is disposed on the upstream side, and the cooling fan 439 is disposed on the downstream side. The cooling fan 438 is disposed adjacent to the intake port 428 and generates a flow (arrow D1) in which air is sucked from the intake port 428. The cooling fan 439 is disposed adjacent to the exhaust port 430 and generates a flow (arrow D2) in which air is blown out from the exhaust port 430.

The plurality of heat dissipation pins 443 are disposed between the cooling fan 438 and the cooling fan 439. The flow of air generated by the cooling fans 438 and 439 passes through the plurality of heat dissipation pins 443 and dissipates the heat of the heat source H transferred to the heat dissipation pins 443.

According to the imaging device 400 of the second embodiment, since one intake port 428 and one exhaust port 430 are provided, the number of intake and exhaust openings is smaller and the appearance is more simplified as compared with the imaging device 2 of the first embodiment. On the other hand, the two cooling fans 438 and 439 are provided inside the penta portion 412, which makes it possible to increase the air volume of intake and exhaust as compared with the case of providing only one cooling fan, and to improve heat dissipation property. This makes it possible to improve the heat dissipation while making the appearance simple, and it is easy to achieve both designability and heat dissipation property.

Positional Relationship Between Built-in Microphone and Cooling Fan

Next, the positional relationship between the built-in microphone built in the imaging device and the cooling fan will be described with reference to FIGS. 25 and 26.

Figure 25:
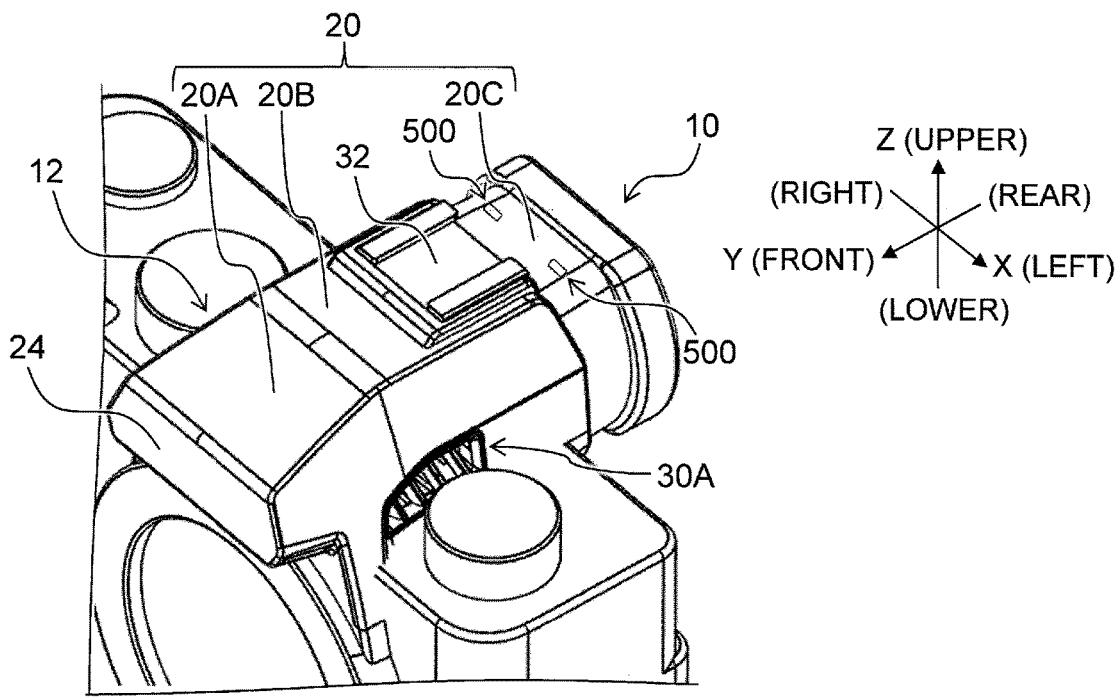
FIG. 25 is a perspective view for explaining a positional relationship between a built-in microphone and the cooling fan.
Figure 26:
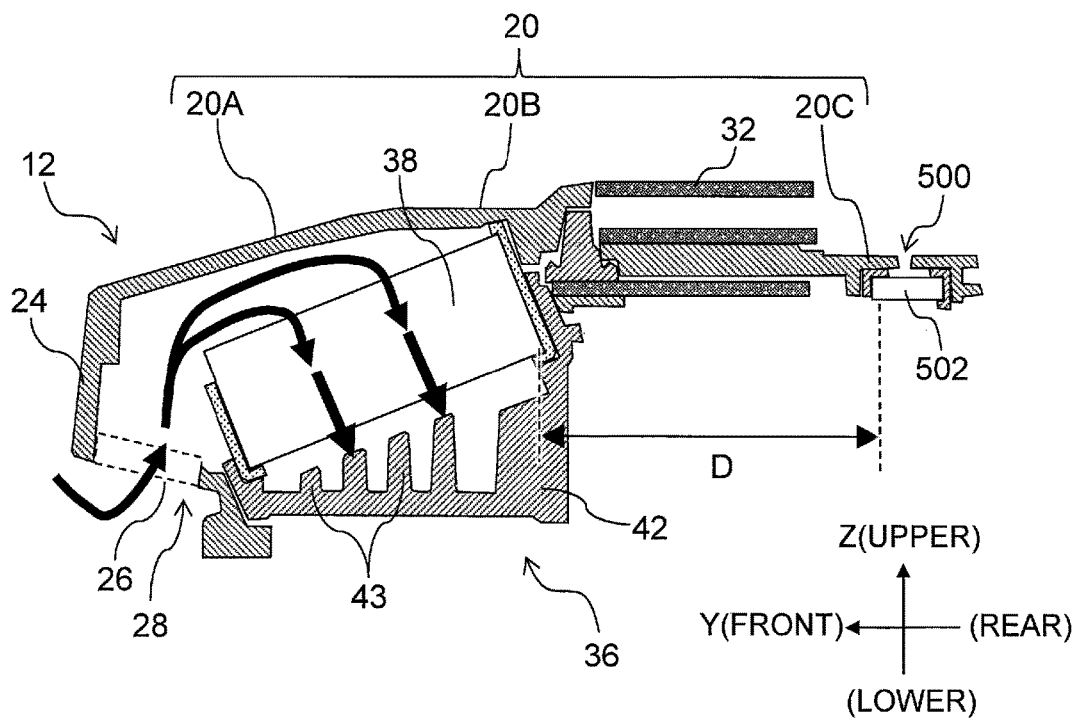
FIG. 26 is a longitudinal sectional view for explaining a positional relationship between the built-in microphone and the cooling fan.

FIG. 25 is a perspective view illustrating a peripheral configuration of the penta portion 12, and FIG. 26 is a longitudinal sectional view illustrating a peripheral configuration of the penta portion 12.

As illustrated in FIG. 25, the upper surface 20 includes a first upper surface 20A, a second upper surface 20B, and a third upper surface 20C.

Among the three upper surfaces 20A, 20B, and 20C, the first upper surface 20A is positioned at the foremost position, the third upper surface 20C is positioned at the rearmost position, and the second upper surface 20B is positioned between the first upper surface 20A and the third upper surface 20C.

The first upper surface 20A is a surface that is connected to the front surface 24 and that is inclined obliquely downward toward the front. The second upper surface 20B is a surface that extends substantially horizontally and that is provided with the accessory shoe 32 described above. The third upper surface 20C is a surface constituting the upper surface of the EVF unit 10, and is provided rearward relative to the accessory shoe 32.

As illustrated in FIG. 25, the third upper surface 20C is provided with a microphone opening 500. The microphone opening 500 is a through hole for allowing a built-in microphone 502 illustrated in FIG. 26 to communicate with an external space. In the example illustrated in FIG. 25, a pair of the built-in microphones 502 are provided in left and right.

As illustrated in FIG. 26, the built-in microphone 502 is provided below the microphone opening 500. The built-in microphone 502 is a microphone for collecting sound through the microphone opening 500, and, unlike the external microphone 34, is built in the imaging device.

According to the arrangement illustrated in FIGS. 25 and 26, by providing the microphone opening 500 on the upper surface 20C, it is possible to increase a distance D (see FIG. 26) between the cooling fan 38 and the built-in microphone 502 as compared with the case where the upper surfaces 20B and 20A are provided with the microphone opening. This makes it difficult for the built-in microphone 502 to collect operation sound of the cooling fan 38, and makes it possible to improve the sound collection accuracy of the built-in microphone 502.

As illustrated in FIG. 26, in the configuration where the cooling fan 38 is disposed forward relative to the accessory shoe 32, the sound collection accuracy of the built-in microphone 502 can be improved by disposing the built-in microphone 502 rearward relative to the accessory shoe 32.

Although the present invention has been described above with reference to the first and second embodiments and the modifications, the present invention is not limited to the first and second embodiments and the modifications. For example, the imaging device needs not include the grip portion 6 or the EVF unit 10. The heat source H is not limited to the image sensor or the image engine, and may be another heat source (for example, a storage unit of a recording medium). In the second embodiment, the two cooling fans 438 and 439 are provided, but only one cooling fan may be provided.

Although the present disclosure has been fully described in connection with the preferred embodiments with reference to the accompanying drawings, various variations and modifications will be apparent to those skilled in the art. It should be understood that such variations and modifications are included within the present disclosure as long as they do not depart from the scope of the present disclosure as set forth in the appended claims. In addition, combinations and changes in order of elements in each embodiment can be realized without departing from the scope and spirit of the present disclosure.

By appropriately combining any embodiments and modifications among the above-described embodiments and various modifications, it is possible to achieve the effects of the respective embodiments and modifications.

The present disclosure can be applied to an imaging device that captures an image of a subject such as a digital camera.

What is claimed is:

1. An imaging device comprising:
an imaging main body;
a fan accommodation portion provided in an upper portion of the imaging main body;
a cooling fan disposed in the fan accommodation portion; and
an intake port and an exhaust port for the cooling fan to perform intake and exhaust,
wherein the fan accommodation portion is a protruding portion having multiple surfaces formed by protruding from the imaging main body at the upper part of the imaging main body,
wherein the multiple surfaces include an upper surface, a pair of side surfaces, and a front surface that cover the cooling fan,
wherein the intake port and the exhaust port are provided on a surface of the fan accommodation portion different from the upper surface, and
wherein air inhaled via the intake port is discharged from the exhaust port to the outside of the fan accommodation portion.

2. The imaging device according to claim 1, wherein the upper surface and the front surface are not provided with intake and exhaust openings.

3. The imaging device according to claim 1, wherein the fan accommodation portion is a protrusion provided above the imaging main body to protrude forward.

4. The imaging device according to claim 1 further comprising a heat sink disposed below the cooling fan,
wherein the cooling fan blows out air downward toward the heat sink.

5. The imaging device according to claim 1, wherein at least one of the intake port and the exhaust port is provided on the side surface.

6. The imaging device according to claim 5, wherein a dial that overlaps at least one of the intake port and the exhaust port provided on the side surface when viewed from a side is erected on the imaging main body.

7. The imaging device according to claim 1, wherein
the front surface is at a position protruding forward relative to the imaging main body, and
a lower surface connecting the front surface and the imaging main body is provided with at least one of the intake port and the exhaust port.

8. The imaging device according to claim 7, wherein the lower surface is provided with the intake port, and the side surface is provided with the exhaust port.

9. The imaging device according to claim 1, wherein the upper surface of the fan accommodation portion is provided with an accessory shoe.

10. The imaging device according to claim 1, wherein a central axis of the cooling fan is inclined with respect to a vertical direction.

11. The imaging device according to claim 1, wherein the cooling fan is an axial fan.

12. The imaging device according to claim 1, wherein the cooling fan is a centrifugal fan.

13. An imaging device comprising,
an imaging main body;
a fan accommodation portion provided in an upper portion of the imaging main body; and
a cooling fan disposed in the fan accommodation portion,
wherein the fan accommodation portion includes an upper surface, a pair of side surfaces, and a front surface that cover the cooling fan,
an intake port and an exhaust port for the cooling fan to perform intake and exhaust are provided on a surface of the fan accommodation portion different from the upper surface,
the upper surface of the fan accommodation portion is provided with an accessory shoe,
the cooling fan is provided forward relative to the accessory shoe, and
the imaging device further comprises a built-in microphone provided rearward relative to the accessory shoe.

14. An imaging device comprising:
an imaging main body;
a fan accommodation portion provided in an upper portion of the imaging main body; and
a cooling fan disposed in the fan accommodation portion,
wherein the fan accommodation portion includes an upper surface, a pair of side surfaces, and a front surface that cover the cooling fan,
an intake port and an exhaust port for the cooling fan to perform intake and exhaust are provided on a surface of the fan accommodation portion different from the upper surface,
a central axis of the cooling fan is inclined with respect to a vertical direction, and
the central axis of the cooling fan is inclined such that a rear side of the cooling fan becomes higher than a front side.

* * * * *